(12) United States Patent
Daniels

(10) Patent No.: US 8,183,582 B2
(45) Date of Patent: May 22, 2012

(54) BARE DIE SEMICONDUCTOR DEVICE CONFIGURED FOR LAMINATION

(75) Inventor: John J. Daniels, Madison, CT (US)

(73) Assignee: Lumachip, Inc., Waterford, CT (US)

( * ) Notice: Subject to any disclaimer, the term of this patent is extended or adjusted under 35 U.S.C. 154(b) by 284 days.

(21) Appl. No.: 12/251,046

(22) Filed: Oct. 14, 2008

(65) Prior Publication Data

US 2009/0095963 A1    Apr. 16, 2009

Related U.S. Application Data

(60) Provisional application No. 60/999,178, filed on Oct. 16, 2007.

(51) Int. Cl.
*H01L 33/00* (2010.01)
*H01L 29/40* (2006.01)

(52) U.S. Cl. .................................................. 257/88

(58) Field of Classification Search .............. 257/88, 257/91, 95, 98–100, 116, 117, 432–437, 257/749, E33.056–E33.059, E25.032, 110, 257/279, 458, 461–464, 470, 490, 494–495, 257/509, 525, 544–550, 656, 927, 929; 438/25, 438/28, 51, 55, 64–68, 83, 98, 208, 912
See application file for complete search history.

(56) References Cited

U.S. PATENT DOCUMENTS

| 6,885,035 | B2 * | 4/2005 | Bhat et al. ................ 257/99 |
| 7,259,030 | B2 | 8/2007 | Daniels et al. |
| 7,294,961 | B2 * | 11/2007 | Daniels et al. ............. 313/504 |
| 7,723,733 | B2 * | 5/2010 | Daniels et al. ............. 257/80 |
| 7,723,737 | B2 * | 5/2010 | Lee et al. .................. 257/88 |
| 7,768,020 | B2 * | 8/2010 | Kim et al. .................. 257/88 |
| 7,772,602 | B2 * | 8/2010 | Lee et al. .................. 257/88 |
| 2002/0053676 | A1 * | 5/2002 | Kozaki ....................... 257/88 |
| 2004/0232439 | A1 * | 11/2004 | Gibb et al. ................. 257/103 |
| 2009/0159902 | A1 * | 6/2009 | Yasuda et al. ............. 257/88 |

FOREIGN PATENT DOCUMENTS

WO  WO2007072967  * 6/2007

* cited by examiner

*Primary Examiner* — Dao H Nguyen
*Assistant Examiner* — Tram H Nguyen
(74) *Attorney, Agent, or Firm* — Adams & Wilks

(57) ABSTRACT

A bare die semiconductor device, e.g., a bare die LED, includes a substrate having a bottom face and a bottom die electrode. There is also a top face having a top face edge, a top face area, a top face periphery and a top die electrode. A semiconductor material provides a p-n semiconductor junction between the top and bottom faces. The top die electrode inhibits an external top planar electrode from contact with the top face edges. Such bare die LEDs can be incorporated into a light sheet that has a transparent first substrate having a planar top electrode and a second substrate having a bottom substrate electrode. An adhesive secures the second substrate to the first substrate. Bare die LEDs are disposed in the adhesive with their top die electrodes contacting the top planar electrode and their bottom die electrodes contacting the bottom substrate electrode.

27 Claims, 5 Drawing Sheets

US 8,183,582 B2

BARE DIE SEMICONDUCTOR DEVICE CONFIGURED FOR LAMINATION

CROSS-REFERENCE TO RELATED APPLICATIONS

This application claims the benefit of U.S. provisional application No. 60/999,178, filed Oct. 16, 2007, which is hereby incorporated herein by reference, in its entirety.

FIELD OF THE INVENTION

The present invention pertains to bare die semiconductor devices that can be assembled into products in a roll-to-roll manufacturing method, and in particular to bare die light emitting diodes for use in a roll-to-roll manufacturing method.

BACKGROUND

Bare die semiconductor devices can be incorporated into various products using roll-to-roll manufacturing method. For example, bare die light emitting diodes (LEDs) can be assembled into an LED sheet that can be used as a photo-radiation source for applications including, but not limited to, general illumination, architectural lighting, novelty lighting, display backlighting, heads-up displays, commercial and roadway signage, monochromatic and full-color static and video displays, a radiation-source for photo-curable materials, patterned light emissive images, and the like.

U.S. Pat. No. 7,259,030 to Daniels, et al. (which is incorporated herein by reference, in its entirety) discloses a roll-to-roll method of making a light active sheet that includes bare die LEDs disposed between planar electrodes. One embodiment of such a light active sheet is shown schematically herein in FIG. 1. The light active sheet 100 includes a bottom substrate 102 that has an electrically conductive upper surface (unnumbered). An insulative hot melt adhesive sheet 104 is provided, and a plurality of bare die LEDs 106 are embedded in the hot melt adhesive sheet. The hot melt adhesive sheet 104 with the bare die LEDs 106 embedded therein is disposed between the electrically conductive surface of the bottom substrate 102 and a transparent top substrate 120 to form a laminate. The top substrate 120 has a top planar electrode 122 that comprises a transparent conductive material (indium tin oxide (ITO)) mounted on a support layer 124. The support layer 124 comprises a transparent support material, i.e., polyethyleneterephthalate (PET). The laminate is run through a heated pressure roller system to melt the hot melt adhesive sheet 104 and electrically insulate and bind the top substrate 120 to the bottom substrate 102. As the hot melt sheet 104 softens, the bare die LEDs 106 break through and come into electrical contact with the top planar electrode 122 and the electrically conductive surface of the bottom substrate 102. The bottom substrate 102, the hot melt adhesive 104 (with the embedded bare die LEDs 106) and the top substrate 112 can be provided as rolls of material. The rolls are brought together in a continuous roll fabrication process, resulting in a flexible sheet of lighting material.

SUMMARY OF THE INVENTION

The present invention resides in one aspect in a bare die semiconductor device that includes a substrate that provides a bottom face and a bottom die electrode. There is a top face having a top face edge, a top face area, a top face periphery and a top die electrode. The bare die semiconductor device includes a semiconductor material that provides a p-n semiconductor junction between the top face and the bottom face. The top die electrode is configured to inhibit contact between an external top planar electrode and the top face edges.

According to another aspect of the invention, the bare die semiconductor device may comprise a bare die light emitting diode (LED).

The invention resides in another aspect in a sheet of light active material. The light sheet includes a transparent first substrate having a planar top electrode and a second substrate having a bottom substrate electrode. An adhesive secures the second substrate to the first substrate. There is a plurality of bare die LEDs as described herein disposed in the adhesive with their respective top die electrodes in contact with the top planar electrode and their respective bottom die electrodes in contact with the bottom substrate electrode.

BRIEF DESCRIPTION OF THE DRAWINGS

Referring now to the Figures, which show exemplary embodiments and wherein the like elements are numbered alike (bear like reference characters).

DETAILED DESCRIPTION OF THE INVENTION

The inventor has recognized a problem encountered when a prior art bare die semiconductor device is incorporated into a laminated semiconductor sheet device, for example, when a prior art bare die LED is incorporated into a light sheet in a process described in the aforesaid U.S. Pat. No. 7,259,030.

Figure 1:
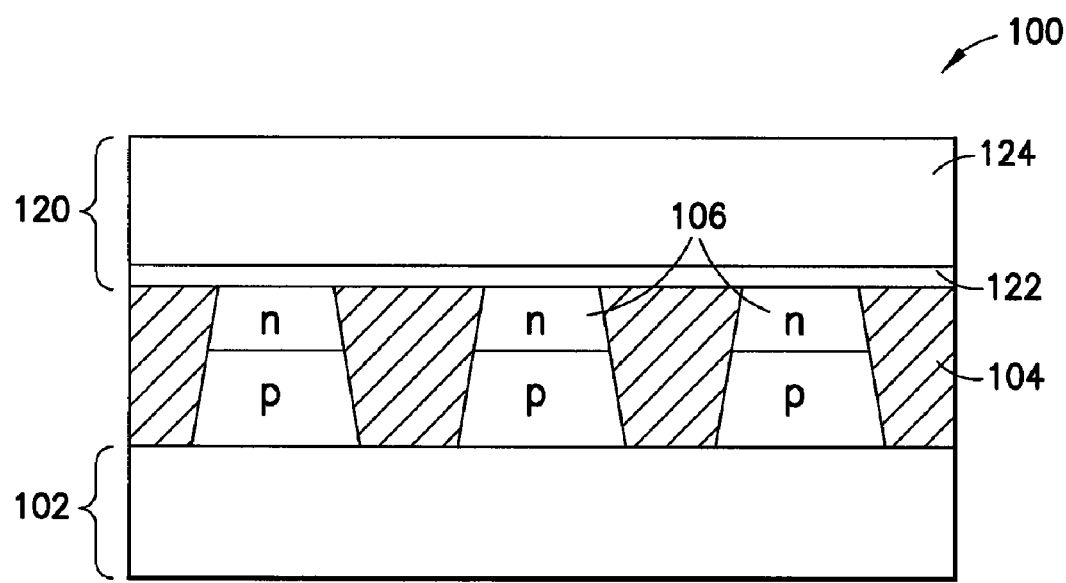
FIG. 1 is a schematic cross-sectional view of a light sheet comprising bare die LEDs according to the prior art.
Figure 2:
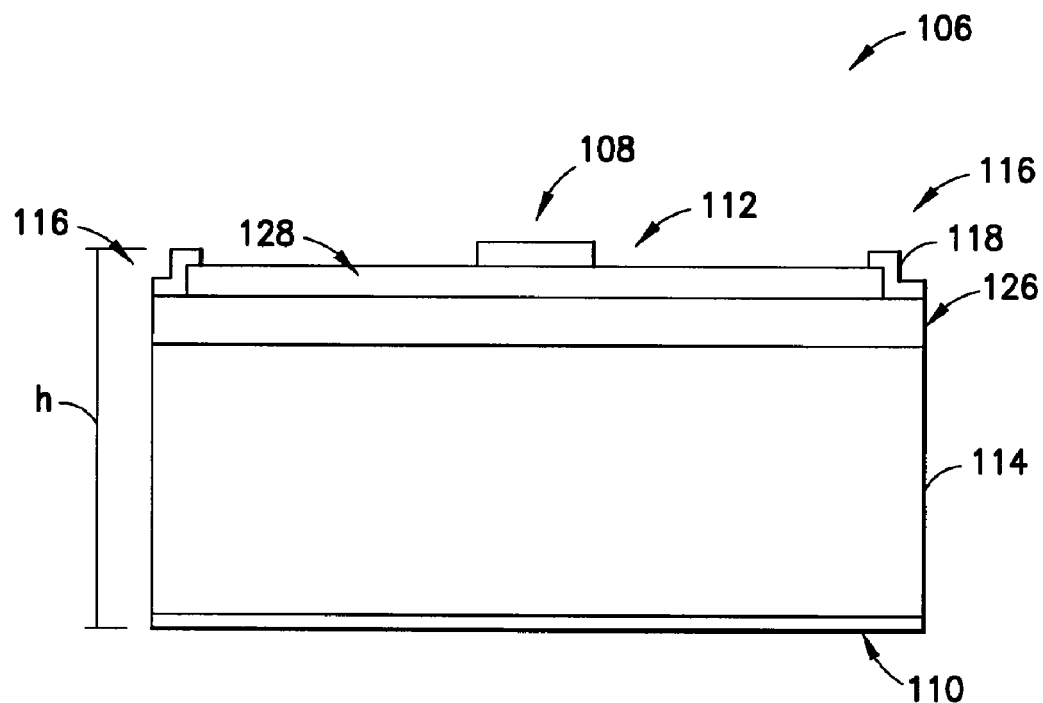
FIG. 2 is a schematic cross-sectional view of a prior art bare die LED.

As seen in FIG. 2, a prior art bare die LED 106 has a top die electrode 108 and a bottom die electrode 110. The top die electrode 108 is formed centrally on a top face 112 of the bare die LED 106. The bare die LED has sides 114, and edges 116 where the sides 114 transition into the top face 112. A layer of indium gallium nitride semiconductor material (the InGaN layer) 128 provides the top face 112 and is doped to provide a p-n junction between the top die electrode 108 and the bottom die electrode 110. The InGaN layer 128 is deposited over a metal layer 126 and is configured so that it does not fully cover the metal layer. The metal layer 126 is therefore electrically exposed at the edges 116 of the bare die LED 106, if the edges are not electrically insulated. A non-insulative passivation structure 118 is formed along the periphery of the bare die LED 106 and provides the edges 116 thereof. In a representative embodiment, the prior art bare die LED 106 may have an overall height h of about 100 micrometers (um) from the bottom die electrode 110 to the passivation structure 118.

Figure 3:
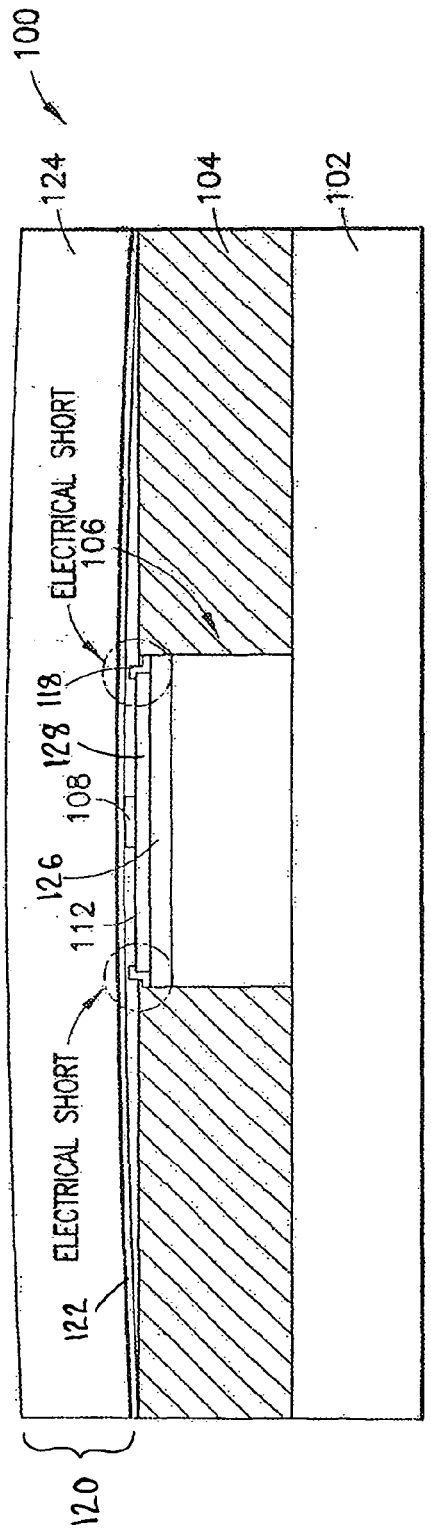
FIG. 3 is a schematic cross-sectional view of a prior art light sheet containing a prior art bare die LED.

When a prior art bare die LED 106 is incorporated into a light active sheet 100 as depicted herein in FIG. 3, the top planar electrode 122 of the top substrate 120 sometimes contacts an edge 116 of the bare die semiconductor device and causes a short-circuit that prevents proper functioning of the device. Specifically, the top substrate 120 engages the top die electrode 108 and slopes downward from the top of the top die electrode towards the hot melt adhesive sheet 104, making contact with the passivation material 118 that constitutes the edges of the bare die LED. Contact between the top planar electrode 122 and the passivation structure 118 causes an alternative path, or an electrical short, for charges to flow around the p-n junction in the InGaN layer 128, thus reducing the device efficiency or causing the device to fail. Such failure may occur even if the optional passivation material is not present, because in such case, the top planar electrode 122 can contact the metal layer 126 as well as the top die electrode 108.

Figure 4:
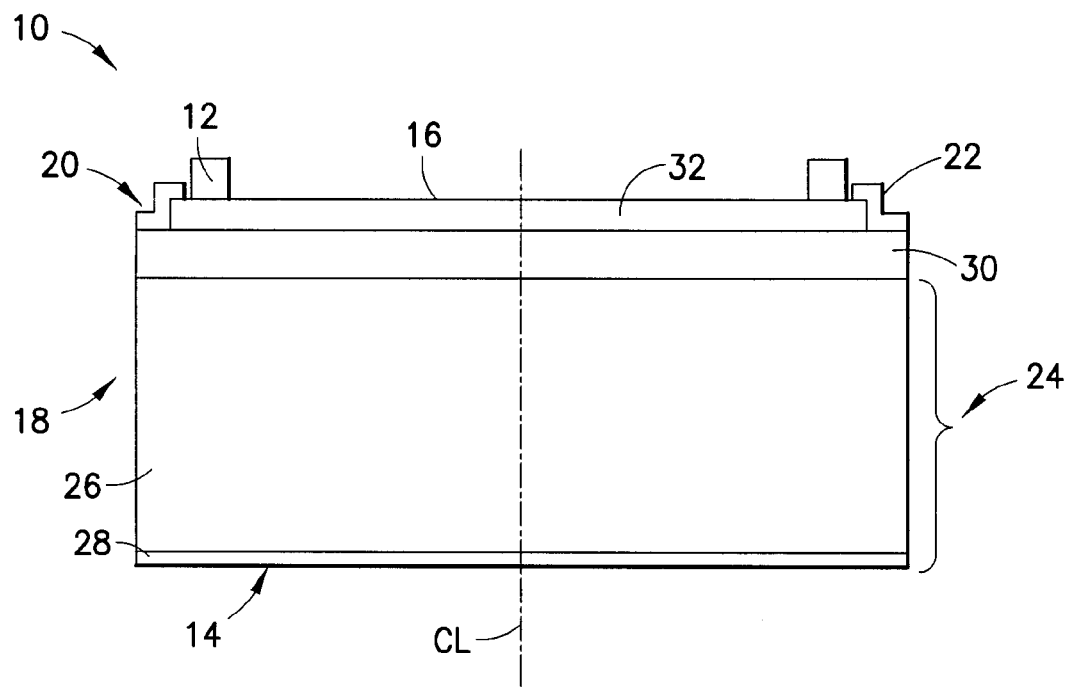
FIG. 4 is a schematic cross-sectional view of a bare die LED in accordance with one aspect of the present invention.

A bare semiconductor die as described herein is configured so that when incorporated into a laminated product, an external conductive substrate in the laminate can make the desired contact with a top electrode without creating an alternative path or short circuit that may limit or prevent charges from flowing through the device. In one embodiment, a bare die LED indicated generally by the numeral 10 in FIG. 4 has a top die electrode 12 formed on a top face 16 of the bare die LED 10. The bare die LED has sides 18 and edges 20 where the sides transition into the top face. An optional non-insulating passivation structure 22 is formed along the periphery of the bare die LED 10 and provides the edges 20 thereof. The bare die LED 10 includes a bottom substrate 24 that comprises a layer of silicon 26 and a bottom conductive layer 28. The bottom conductive layer 28 serves as a bottom die electrode and provides the bottom face 14 of the bare die LED. In a representative embodiment, the silicon layer 26 may be about 90 um thick, but the invention is not limited in this regard, as any suitable thickness may be employed. The bare die LED 10 contains a metal layer 30 on the layer of silicon 26 and an InGaN layer 32 on the metal layer. The InGaN layer 32 provides the top face 16 on which the top die electrode 12 is formed. In a particular embodiment, the InGaN layer 32 may be about 2 micrometers (um) thick, although the invention is not limited in this regard, as other thicknesses may be employed. The top die electrode 12 is formed on the InGaN layer 32. A p-n semiconductor junction is formed in the InGaN layer 32, between the top face 16 and the bottom face 14.

Figure 5:
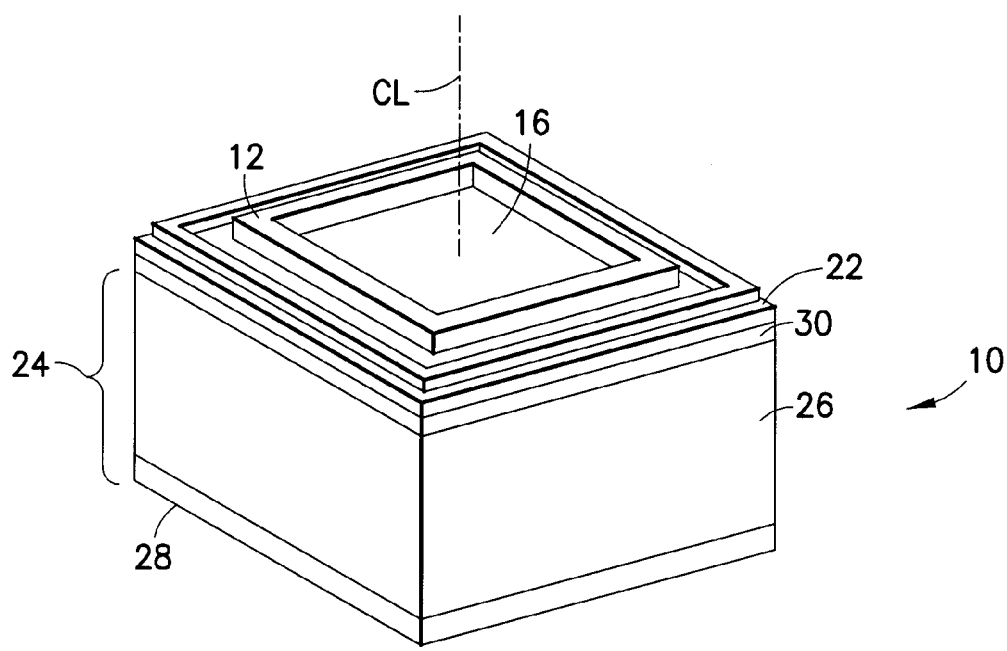
FIG. 5 is a schematic perspective view of the bare die LED of FIG. 4.
Figure 6:
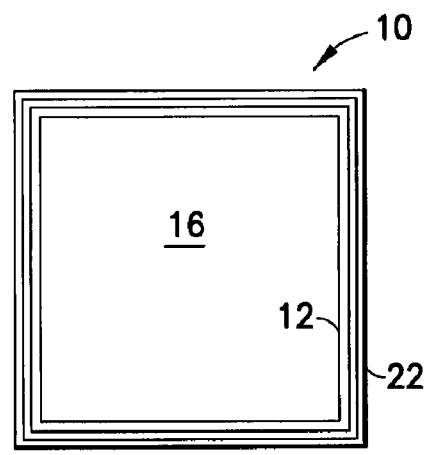
FIG. 6 is a schematic plan view of the bare die LED of FIG. 4.

The top die electrode 12 is disposed on the top face 16 near the edges 20 of the bare die LED 10, i.e., closer to the edges 20 of the bare die LED than to the center indicated by the center line CL. The top die electrode 12 protrudes upward from the top face 16 beyond the uppermost surface of the passivation structure 22. As seen in FIG. 5 and FIG. 6, the top face 16 of the bare die LED 10 has a generally rectangular configuration, and the top die electrode 12 is configured as a rectangular ring-shaped protrusion on the top face within the periphery of the bare die LED.

One or more bare die LEDs 10 can be disposed between planar electrodes that are external to the bare die LEDs to form a sheet of light active material in a lamination process such as the one described in U.S. Pat. No. 7,259,030. One example of such a sheet is generally designated by the numeral 50 in FIG. 7, wherein it can be seen that a bare die LED 10 is held between a top substrate 32 and a bottom substrate 34 by a hot melt adhesive layer 36. The top substrate 32 includes a top planar electrode 38 that comprises a layer of transparent conductive material, e.g., indium tin oxide (ITO), on a transparent support layer 40 that may comprise, e.g., PET. The bottom substrate 34 includes a planar bottom electrode 42 on a bottom support material 44. The planar bottom electrode 42 may comprise a layer of copper applied to the bottom support material 44.

As stated above, the top die electrode 12 is configured to inhibit contact between the external top planar electrode 112 and the edges 20 of the LED, i.e., to avoid contact of an external planar electrode with the peripheral passivation structure 22. Specifically, due to the proximity of the top die electrode 12 to the edges 20, and because the top die electrode 12 rises higher than the top surface of the passivation structure 22 (relative to the top face 16), the top planar electrode 38 resting on the top die electrode 12 does not contact the edges 20 of the bare die LED 10 even though the top planar electrode tends to slope downward from the top of the top die electrode 12 towards the adhesive layer 36. In the assembled light sheet 50, the top planar electrode 38 remains separated from the passivation layer 22, i.e., separated from the edges of the bare die LED 10. In this way, the top die electrode 12 prevents the external top planar electrode 38 from having a deleterious effect on the performance of the bare die LED 10 due to a short circuit around the p-n junction.

While FIG. 4, FIG. 5, FIG. 6 and FIG. 7 show a bare die LED 10 with a top die electrode 52 having only a peripheral portion, the invention is not limited in this regard, and in other embodiments, the top die electrode may comprise other portions, such as a charge-facilitating portion. For example, as shown in FIG. 8, the bare die LED 50 has a top die electrode 52 on the top face 54 the top die electrode including a peripheral portion 52a and an electrode bar 52b disposed within, and connected to, the peripheral portion. The peripheral portion 52a is disposed on the top face 54 near the passivation material 22 of the bare die LED 50, i.e., near the edge of the bare die LED. The electrode bar 52b provides a charge facilitating portion that helps distribute the electric potential provided between a top external planar conductor and a bottom external planar conductor more evenly across the top face of the bare die LED 50 than a top die electrode having only a peripheral portion could do.

Figure 9:
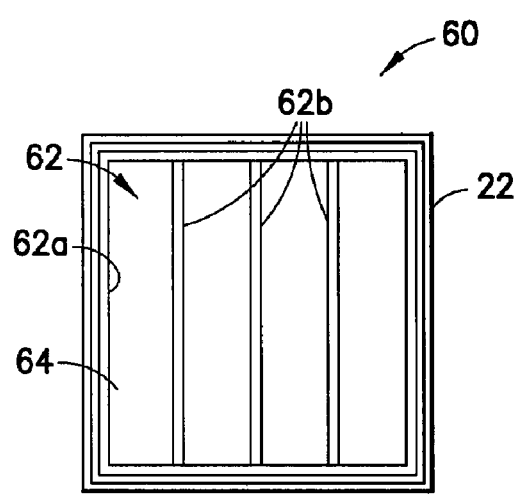
FIG. 9 is a schematic plan view of a bare die LED in accordance with another embodiment of the present invention.
Figure 10:
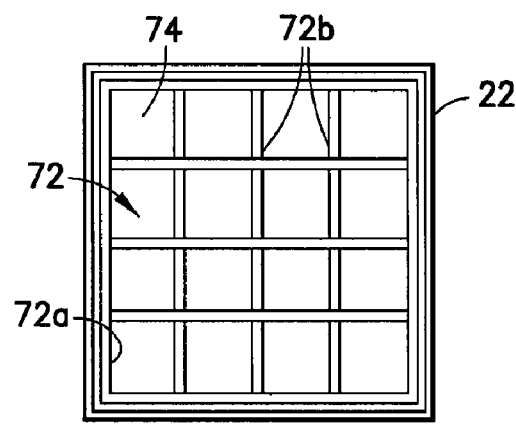
FIG. 10 is a schematic plan view of a bare die LED in accordance with another embodiment of the present invention.
Figure 11:
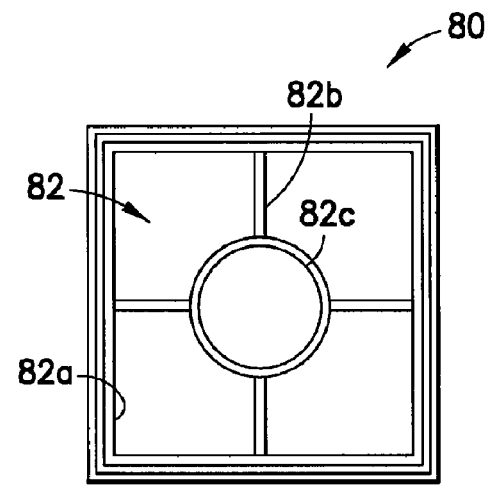
FIG. 11 is a schematic plan view of a bare die LED in accordance with another embodiment of the present invention.

While FIG. 8 shows a bare die LED 50 with a top die electrode 52 that has a single, straight electrode bar 52b within the peripheral portion 52a to serve as a charge-facilitating portion, the invention is not limited in this regard. In other embodiments, the charge-facilitating portion may have various configurations. For example, the bare die LED 60 in FIG. 9 has a top die electrode on the top face 64, and the top die electrode has a peripheral portion 62a near the passivation material 22 (i.e., near the edge of the bare die LED 60) and a plurality of electrode bars 62b disposed within, and connected to, the peripheral portion and in parallel to each other to form a grid on the top face of the bare die LED. The parallel electrode bars 62b provide a charge facilitating portion of the top die electrode 62. In FIG. 10, a bare die LED 70 has a top die electrode 72 on the top face 74, and the top die electrode 72 that has a peripheral portion 72a near the passivation material 22 and a grid configuration of mutually intersecting electrode bars 72b therein to provide a charge-facilitating portion. FIG. 11 shows a bare LED die 80 that has a top die electrode 82 on the top face 84, and the top die electrode 82 has a peripheral portion 82a near the passivation material 22 and a grid configuration of electrode bars 82b with a circular lattice element 82c therein to provide a charge-facilitating portion.

Figure 7:
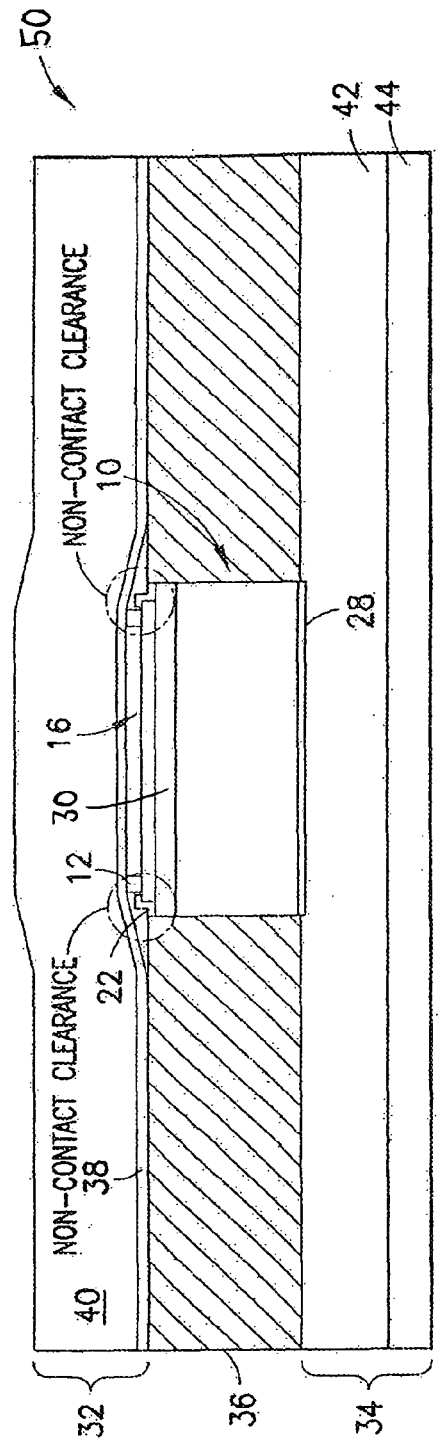
FIG. 7 is a schematic cross-sectional view of a light sheet containing the bare die LED of FIG. 4.
Figure 8:
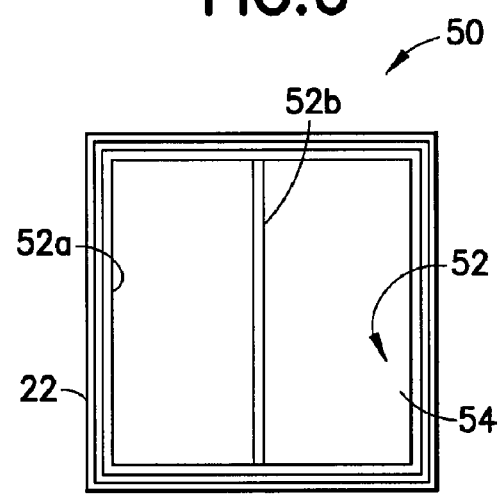
FIG. 8 is a schematic plan view of a bare die LED in accordance with another embodiment of the present invention.
Figure 12:
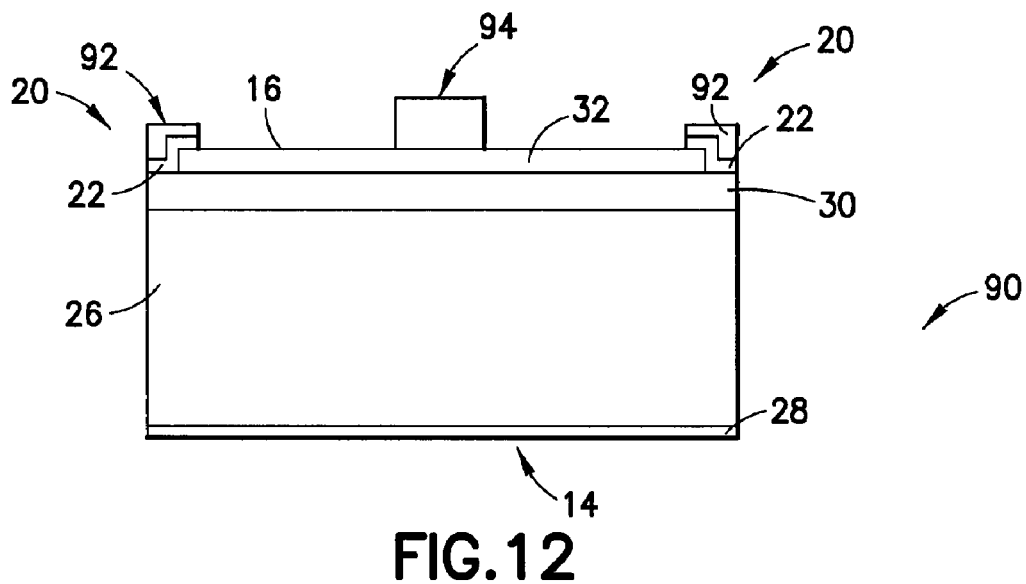
FIG. 12 is a schematic cross-sectional view of a bare die LED in accordance with another embodiment of the present invention.

FIG. 4-FIG. 11 show bare die LEDs with top die electrodes that include peripheral portions that are positioned near to, and that are higher than, the peripheral edges of the bare die LEDs on which they are formed. However, the invention is not limited in this regard, and in other embodiments, a bare die LED may include other features to prevent a top planar electrode that is in contact with a top die electrode from causing a short circuit around a p-n junction. For example, FIG. 12 shows a bare die LED 90 having an InGaN layer 32 disposed on a metal layer 30, the InGaN layer providing a top face 16 and being configured to expose the metal layer at the edges of the bare die LED. A non-insulating passivation layer 22 is deposited along the top periphery of the bare die LED 90 and provides the edges 20 thereof. A layer of insulating material 92 is disposed on the passivation material 22. The insulating material may comprise a ceramic or polymeric material roughly 0.00025" (¼ mil). Depending on the material used and the deposition method, this thickness can be more or less. A top die electrode 94 is formed on the top face 16. The top die electrode 94 has high profile, i.e., the top die electrode has a height greater than a conventional top conductor. For example, the top die electrode 94 may have a height of at least about 2-3 mils (thousandths of an inch) above the top face 16 of the bare die LED 90. This about 2-3 times the height of the top conductor of a typical bare die LED 90. The additional height of the top die electrode is to provide better breaking through of the top die electrode through the hot melt adhesive sheet 36 of the Lightsheet 100. The result is better face to face electrical contact with the transparent conductor of the top substrate 32. The metal layer 30 is disposed on a layer of silicon 26 that also has a bottom conductive layer 28. The bottom conductive layer 28 serves as a bottom die electrode and provides the bottom face 14 of the bare die LED. When the bare die LED 90 is incorporated into a light sheet having a top substrate 32 as shown in FIG. 7, the insulating material 92 electrically isolates the metal layer 30, so it is of no consequence if a top planar electrode 38 in contact with the top die electrode 94 also contacts an edge of the bare die LED 90.

Figure 13:
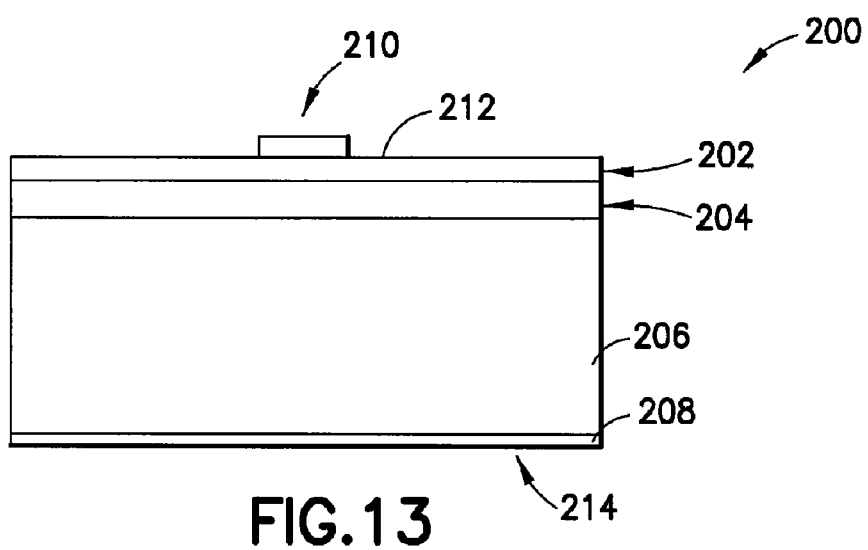
FIG. 13 is a schematic cross-sectional view of a bare die LED in accordance with another embodiment of the present invention.

In another embodiment, a bare die LED 200 shown in FIG. 13 includes an InGaN layer 202 on a metal layer 204 that is supported by a silicon substrate 206 and a bottom conductor 108. The bottom conductor 108 provides the bottom face 214 of the bare die LED 200. There is a top die electrode 210 on the top face 212 of the bare die LED 200. The top die electrode 210 is configured to have any suitable height above the top face 212. The layer of semiconductor material 202 has a side-to-side configuration that matches that of the metal layer 204. Therefore, the metal of the metal layer 204 is not exposed at the edge of the bare die LED 200, and it is of no consequence if a top planar electrode 38 in contact with the top die electrode 210 also contacts an edge of the bare die LED. Accordingly, the top die electrode 210 may have any suitable configuration.

Figure 14:
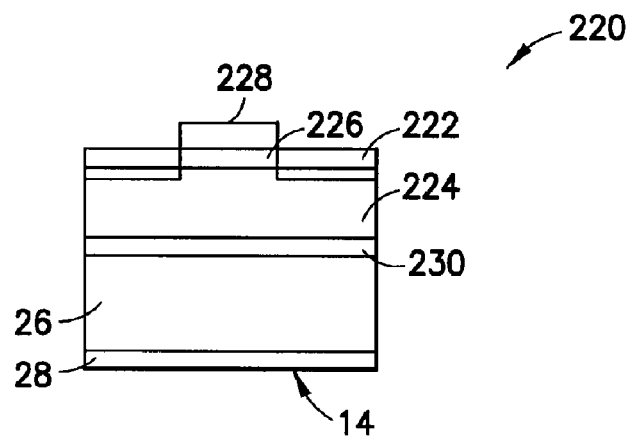
FIG. 14 is a schematic cross-sectional view of a bare die LED in accordance with another embodiment of the present invention.

According to yet another embodiment, a bare die LED indicated generally by the numeral 220 in FIG. 14 includes a transparent insulating layer 222 that is applied over the LED structure 224. A top layer 226 of semiconductor material is formed as part of the LED structure 224, and the transparent insulating layer 222 is configured to expose the top layer 226. A top die electrode 228 (which may serve as an n-electrode) is formed on the top layer 226 to protrude above the transparent insulating layer 222. The transparent insulating layer 222 insulates an internal metal layer 230 from contact with a top planar electrode 38 to prevent a short circuit between the top die electrode 228 and the internal metal layer 228 should such top planar electrode contact an edge of the bare die LED 220. The internal metal layer 230 is disposed on a layer of silicon 26 that also has a bottom conductive layer 28. The bottom conductive layer 28 serves as a bottom die electrode (e.g., as a p-contact) and provides the bottom face 14 of the bare die LED. When the bare die LED 220 is incorporated between planar electrodes in a light sheet, it is of no consequence if a top planar electrode in contact with the top die electrode 228 also contacts an edge of the bare die LED 220 because the top planar electrode will contact the transparent insulating layer 222 rather than short circuit the bare die LED.

In various embodiments disclosed herein, a bare die LED may have a top die electrode that is configured so that it does not substantially inhibit the emission of light from the bare die LED. In such embodiments, the top die electrode occupies a minor proportion of the top face of the bare die LED, i.e., the top die electrode occupies less than 50% of the area of the top face of the bare die LED.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Although the invention has been described with reference to particular embodiments thereof, it will be understood by one of ordinary skill in the art, upon a reading and understanding of the foregoing disclosure, that numerous variations and alterations to the disclosed embodiments will fall within the scope of this invention and the appended claims.

What is claimed is:

1. A bare die light emitting semiconductor device comprising: a substrate having a bottom face; a bottom die electrode disposed on the bottom face; a top face having a top face area bounded by a top face edge; a top die electrode disposed on the top face; and a semiconductor material electrically connected at a bottom side to the bottom die electrode through the substrate and electrically connected at a top side to the top face, the bottom side and the top side being on opposite sides of the semiconductor material, the semiconductor material having a p-n semiconductor junction between the top face and the bottom face; wherein the top die electrode is configured to inhibit contact between an external top planar electrode and the top face edge, and the top die electrode is disposed as a raised structure near the top face edge so that the raised structure inhibits contact between the external top planar electrode and the top face edge to facilitate avoidance of electrical shorting between the top planar electrode and the bottom die electrode, and to facilitate electrical current flow through the p-n semiconductor junction.

2. The bare die semiconductor device of claim 1, wherein the top die electrode has a grid configuration.

3. The bare die semiconductor device of claim 1, further comprising an insulating material on the top face edge.

4. A bare die light emitting diode (LED) comprising: a substrate having a bottom face; a bottom die electrode disposed on the bottom face; a top face having a top face area bounded by a top face edge; a top die electrode disposed on the top face; and a p-n semiconductor junction electrically connected at a bottom side to the bottom die electrode through the substrate and electrically connected at a top side to the top face, the bottom side and the top side of the p-n junction being formed between the top face and the bottom face; wherein the top die electrode is configured to inhibit contact between an external top planar electrode and the top face edge.

5. The bare die LED of claim 4, wherein the top die electrode is disposed near the top face edge.

6. The bare die LED of claim 5, wherein the top die electrode has a grid configuration.

7. The bare die light emitting semiconductor device of claim 1, wherein the top die electrode has a top die electrode area, and wherein the top die electrode area is less than one-half of the top face area.

8. The bare die light emitting semiconductor device of claim 1, further comprising a passivation material disposed around the top face edge.

9. The bare die light emitting semiconductor device of claim 8, further comprising an insulating material on the top face edge.

10. A sheet of light active material, comprising: a transparent first substrate having a planar top electrode; a second substrate having a bottom substrate electrode; an adhesive securing the second substrate to the first substrate; and a plurality of bare die LEDs according to claim 5 disposed in the adhesive with their respective top die electrodes in contact with the top planar electrode and their respective bottom die electrodes in contact with the bottom substrate electrode.

11. The light sheet of claim 10, comprising bare die LEDs having top die electrodes disposed near the top face edges.

12. The light sheet of claim 11, comprising bare die LEDs having top die electrodes that have grid configurations.

13. The light sheet of claim 10, further comprising bare die LEDs comprising an insulating material on the top face edges.

14. The light sheet of claim 10, comprising bare die LEDs having top die electrodes that occupy less than one-half of the top face areas.

15. The light sheet of claim 10, comprising bare die LEDs that include passivation materials disposed around the top face edges.

16. A bare die light emitting semiconductor device according to claim 1; wherein the top face includes a light emissive surface; and the top die electrode comprises a conductive material deposited near the top face edge while leaving uncovered most of the light emissive surface.

17. A bare die light emitting semiconductor device according to claim 16; wherein the conductive material comprises a deposited metal.

18. A bare die light emitting semiconductor device according to claim 1; wherein the top face includes a light emissive surface; and the top die electrode is configured to form a raised border substantially near the top face edge while leaving uncovered most of the light emissive surface.

19. A bare die light emitting semiconductor device according to claim 1; wherein the top face includes a light emissive surface; and the top die electrode is configured and dimensioned to electrically connect the p-n junction with the external top planar electrode without requiring a wire bond.

20. The bare die light emitting semiconductor device of claim 1, wherein the top die electrode extends around the periphery of the top face area and projects upwardly therefrom a distance sufficient to prevent the external top planar electrode from making contact with the top face edge.

21. The bare die light emitting semiconductor device of claim 20, wherein the top die electrode extends continuously, without interruption, around the periphery of the top face area.

22. The bare die LED of claim 4, wherein the top die electrode extends around the periphery of the top face area and projects upwardly therefrom a distance sufficient to prevent the external top planar electrode from making contact with the top face edge.

23. The bare die LED of claim 22, wherein the top die electrode extends continuously, without interruption, around the periphery of the top face area.

24. A bare die light emitting semiconductor device comprising: a substrate having opposed top and bottom faces; a bottom die electrode disposed on the substrate bottom face; a semiconductor layer disposed on the substrate top face and forming a p-n semiconductor junction electrically connected at a bottom side to the bottom die electrode through the substrate; and a top die electrode disposed on the semiconductor layer and electrically connected to a top side of the p-n semiconductor junction, the top die electrode extending around a peripheral marginal portion of the semiconductor layer and projecting upwardly from the semiconductor layer a distance sufficient to prevent an external planar electrode that is placed over the top of the bare die light emitting semiconductor device in contact with the top die electrode from making contact with a top peripheral edge of the substrate.

25. A bare die light emitting semiconductor device according to claim 24; further including a passivation material disposed on and extending around a peripheral edge portion of the semiconductor layer outwardly of the top die electrode.

26. A bare die light emitting semiconductor device according to claim 24; further including a metal layer interposed between the semiconductor layer and the substrate top face, the p-n semconductor junction being electrically connected to the bottom die electrode through the metal layer and the substrate.

27. A bare die light emitting semiconductor device according to claim 24; wherein the top die electrode has a ring shape and leaves uncovered most of the semiconductor layer on which the ring-shaped electrode is disposed.

* * * * *